(12) United States Patent
Zhang et al.

(10) Patent No.: US 10,868,190 B2
(45) Date of Patent: Dec. 15, 2020

(54) TOP-GATE THIN FILM TRANSISTOR, MANUFACTURING METHOD THEREOF, ARRAY SUBSTRATE AND DISPLAY PANEL COMPRISING TOP-GATE THIN FILM TRANSISTOR

(71) Applicant: BOE Technology Group Co., Ltd., Beijing (CN)

(72) Inventors: Jianye Zhang, Beijing (CN); Wei Li, Beijing (CN); Xing Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/822,429

(22) Filed: Nov. 27, 2017

(65) Prior Publication Data

US 2018/0294360 A1    Oct. 11, 2018

(30) Foreign Application Priority Data

Apr. 7, 2017   (CN) .......................... 2017 1 0224236

(51) Int. Cl.
*H01L 29/66*   (2006.01)
*H01L 29/78*   (2006.01)
(Continued)

(52) U.S. Cl.
CPC ...... *H01L 29/78633* (2013.01); *C09D 183/08* (2013.01); *G03F 7/038* (2013.01);
(Continued)

(58) Field of Classification Search
CPC ......... H01L 29/66; H01L 29/78; H01L 27/12; H01L 27/122; H01L 27/1225; H01L 29/66969; H01L 29/7869; H01L 29/78633
See application file for complete search history.

(56) References Cited

U.S. PATENT DOCUMENTS

| 6,608,658 B1 * | 8/2003 | Tsujimura ........... H01L 27/1214 349/110 |
| 2002/0038998 A1 * | 4/2002 | Fujita ................... G09G 3/3233 313/495 |

(Continued)

FOREIGN PATENT DOCUMENTS

| CN | 102471616 A | 5/2012 |
| CN | 103579356 A | 2/2014 |

(Continued)

OTHER PUBLICATIONS

First Office Action, including Search Report, for Chinese Patent Application No. 201710224236.7, dated Oct. 29, 2018, 18 pages.
(Continued)

*Primary Examiner* — Fazli Erdem
(74) *Attorney, Agent, or Firm* — Westman, Champlin & Koehler, P.A.

(57) ABSTRACT

The present disclosure provides a top-gate thin film transistor, a manufacturing method thereof, and an array substrate and a display panel each comprising the top-gate thin film transistor. The top-gate thin film transistor comprises a light-shielding layer formed between the base substrate and the active layer and made of a non-metallic material. The non-metallic material may be a silicone material, such as a polyhedral oligomeric silsesquioxane or a linear silicone resin.

14 Claims, 9 Drawing Sheets

(51) Int. Cl.
*H01L 27/12* (2006.01)
*H01L 29/786* (2006.01)
*G03F 7/038* (2006.01)
*G03F 7/075* (2006.01)
*C09D 183/08* (2006.01)
*C08G 77/04* (2006.01)
*C08G 77/26* (2006.01)

(52) U.S. Cl.
CPC ........ *G03F 7/0757* (2013.01); *H01L 27/1225* (2013.01); *H01L 29/66969* (2013.01); *H01L 29/7869* (2013.01); *C08G 77/045* (2013.01); *C08G 77/26* (2013.01)

(56) References Cited

U.S. PATENT DOCUMENTS

| | | | | |
|---|---|---|---|---|
| 2002/0117671 | A1* | 8/2002 | Tateishi | H01L 29/66757 257/72 |
| 2009/0189317 | A1* | 7/2009 | Sato | B82Y 10/00 264/447 |
| 2009/0261333 | A1* | 10/2009 | Chang | G02F 1/1362 257/59 |
| 2012/0104529 | A1 | 5/2012 | Tanaka | |
| 2014/0151708 | A1* | 6/2014 | Jeon | H01L 29/66969 257/72 |
| 2015/0214254 | A1* | 7/2015 | Yan | H01L 29/66969 257/72 |
| 2015/0378182 | A1* | 12/2015 | Shin | H01L 51/5284 257/40 |
| 2016/0259095 | A1* | 9/2016 | Kim | G02B 5/003 |
| 2016/0343742 | A1* | 11/2016 | Huang | H01L 29/786 |
| 2016/0372662 | A1 | 12/2016 | Takizawa et al. | |
| 2017/0317189 | A1* | 11/2017 | Tu | H01L 29/66757 |
| 2018/0145094 | A1* | 5/2018 | Yan | G02F 1/133345 |
| 2018/0294360 | A1 | 10/2018 | Zhang et al. | |
| 2018/0299736 | A1* | 10/2018 | Li | G02F 1/136209 |
| 2018/0308948 | A1* | 10/2018 | Li | H01L 21/28158 |
| 2018/0331205 | A1* | 11/2018 | Zhang | H01L 29/66742 |
| 2019/0043996 | A1* | 2/2019 | Liu | H01L 29/78633 |

FOREIGN PATENT DOCUMENTS

| | | |
|---|---|---|
| CN | 105845721 A | 8/2016 |
| CN | 106462071 A | 2/2017 |
| CN | 106981478 A | 7/2017 |
| WO | 2015/133375 A1 | 9/2015 |

OTHER PUBLICATIONS

Office Action, including Search Report, for Chinese Patent Application No. 201710224236.7, dated Mar. 22, 2019, 20 pages.

* cited by examiner

TOP-GATE THIN FILM TRANSISTOR, MANUFACTURING METHOD THEREOF, ARRAY SUBSTRATE AND DISPLAY PANEL COMPRISING TOP-GATE THIN FILM TRANSISTOR

CROSS-REFERENCE TO RELATED APPLICATION

This application claims a priority to Chinese Patent Application No. 201710224236.7 filed on Apr. 7, 2017, the disclosures of which are incorporated in their entirety by reference herein.

TECHNICAL FIELD

The present disclosure relates to the field of display technology, in particular to a top-gate thin film transistor, a manufacturing method thereof, and an array substrate and a display panel each comprising the top-gate thin film transistor.

BACKGROUND

Flat panel displays (FPDs) have become a mainstream product in the market of displays. There are also more and more types of flat panel displays, including, for example, liquid crystal displays (LCDs), organic light-emitting diodes (OLEDs) displays, plasma display panels (PDPs) and field emission displays (FEDs), and so on.

As a core technology of the FPD industry, the backplane technology for thin film transistors (TFTs), especially metal oxide thin film transistors (MOTFTs), also undergoes profound changes. Since the MOTFT has high mobility of about 5 to 50 $cm^2/Vs$, excellent large area uniformity and other characteristics, the MOTFT technology has been attracting the industry's attention since its inception. The technology of a white organic light emitting diode (WOLED) plus a color filter (CF) becomes a development direction of an active matrix organic light emitting diode (AMOLED). Due to its high utilization rate of organic electroluminescent material, low requirement on a mask plate for evaporation of electroluminescent material, an improved aperture ratio due to the use of a top emission electroluminescent device and other advantages, it also attracts much attention. However, as a key technology, the selection of a semiconductor for a channel layer should not only focus on indicators such as the mobility, but also consider issues related to the complexity of the process.

Since the backplane of the top-gate structure has the advantages of high mobility and low parasitic capacitance, the flat panel displays using the top-gate structure are widely used. At present, the top-gate bottom emission or top emission backplanes require the addition of a light-shielding layer, and the manufacturing of the conventional metal light-shielding layer needs multiple processes. Therefore, the backplanes of the existing top-gate structures have not only the problem of the complex process but also the problem of the parasitic capacitance.

SUMMARY

In view of this, an object of the present disclosure is to provide a top-gate thin film transistor and a manufacturing method thereof, which are capable of solving the problems of the parasitic capacitance and the complex manufacturing process.

Further, an object of the present disclosure is further to provide an array substrate and a display panel each including the top-gate thin film transistor.

According to a first aspect of the present disclosure, it provides a top-gate thin film transistor including a light-shielding layer formed between a base substrate and an active layer and made of a non-metallic material.

In an embodiment of the present disclosure, the light-shielding layer is made of a photocurable silicone material.

In an embodiment of the present disclosure, the light-shielding layer is made of a negative photocurable silicone material.

In an embodiment of the present disclosure, the photocurable silicone material is a polyhedral oligomeric silsesquioxane or a linear silicone resin;

the polyhedral oligomeric silsesquioxane has a structure shown as follows:

the linear silicone resin has a structure shown as follows:

in which each R is independently a photosensitive group derived from a negative photoresist.

In some embodiments of the present disclosure, a fluorane black type dye and/or a crystal violet type dye is added to the photocurable silicone material.

In some embodiments of the present disclosure, the light-shielding layer is located between a source electrode layer and a drain electrode layer of a source and drain electrode layer and sandwiched between the base substrate and the active layer.

In some embodiments of the present disclosure, both sides of the light-shielding layer are in direct contact with the base substrate and the active layer, respectively.

In some embodiments of the present disclosure, the light-shielding layer has a thickness less than or equal to that of the source and drain electrode layer.

In some embodiments of the present disclosure, the source and drain electrode layer has a thickness of from 1 to 2 micrometers; and/or the light-shielding layer has a thickness less than 1 micrometer.

The present disclosure further provides a method for manufacturing a top-gate thin film transistor, including steps of: forming a light-shielding layer made of a non-metallic material on a base substrate; and forming an active layer on the light-shielding layer.

In some embodiments of the present disclosure, the step of forming the light-shielding layer on the base substrate includes: depositing a source and drain metal thin film on the base substrate, and patterning the source and drain metal thin film to form a source and drain electrode layer; and depositing or coating a thin film of a non-metallic material on the source and drain electrode layer, and performing back side exposure and development on the thin film of the non-metallic material by using the source and drain electrode layer as a mask plate so as to form the light-shielding layer.

In some embodiments of the present disclosure, the light-shielding layer is made of a photocurable silicone material.

In some embodiments of the present disclosure, the light-shielding layer is made of a negative photocurable silicone material.

In some embodiments of the present disclosure, a fluorane black type dye or a crystal violet type dye is added to the photocurable silicone material.

In some embodiments of the present disclosure, the light-shielding layer has a thickness less than or equal to that of the source and drain electrode layer.

The present disclosure further provides an array substrate including the top-gate thin film transistor of any of the embodiments as described above.

The present disclosure further provides a display panel including the top-gate thin film transistor of any of the embodiments as described above.

DETAILED DESCRIPTION

To make the object, technical solutions and advantages of the present disclosure more apparent, the present disclosure will be further explained in detail in conjunction with specific embodiments and with reference to the drawings.

Figure 1:
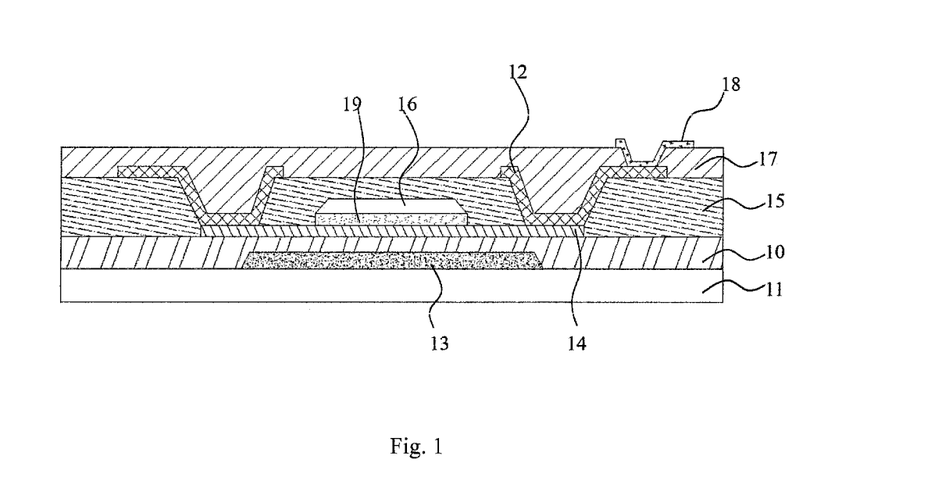
FIG. 1 is a structural schematic view of a top-gate thin film transistor in related art.

A top-gate bottom emission or top emission backplane is usually provided with a light-shielding layer, such as a metal light-shielding layer. The formation of the metal light-shielding layer needs multiple processes. As shown in FIG. 1, the top-gate thin film layer may include a base substrate 11, a metal light-shielding layer 13 formed on the base substrate 11, a buffer layer 10 formed on the light-shielding layer 13, an active layer 14 formed on the buffer layer, a gate insulating layer 19 formed on the active layer 14, a gate electrode 16 formed on the gate insulating layer 19, an interlayer insulating layer 15 formed on the gate electrode 16 and the active layer 14, a source and drain electrode layer 12 formed on the interlayer insulating layer 15, a passivation layer 17 formed on the interlayer insulating layer 15 and the source and drain electrode layer 12, and a pixel electrode 18 formed on the passivation layer 17. The source and drain electrode layer 12 is connected to the active layer 14 through a via hole provided in the interlayer insulating layer 15, and the pixel electrode 18 is connected to the source and drain electrode layer 12 through a via hole provided in the passivation layer 17. The backplane of this top-gate structure has the problem of the complex manufacturing process as well as the problem of the parasitic capacitance.

According to one aspect of the present disclosure, it provides a top-gate thin film transistor including a light-shielding layer formed between a base substrate and an active layer and made of a non-metallic material.

Since the top-gate thin film transistor provided in the present disclosure uses the non-metallic material as the light-shielding layer, not only the parasitic capacitance generated in the case of the metal layer being the light-shielding layer is avoided, but also the influence of light leakage on the active layer region can be effectively reduced. As a result of this, the product yield and device performance are effectively improved. Furthermore, it is also possible to simplify the structure of the thin film transistor, making it possible to effectively reduce the complexity of the process and the manufacturing procedures of the thin film transistor. Moreover, the method for manufacturing the top-gate thin film transistor provided in the present disclosure may adopt a self-alignment exposure technology (that is, no extra mask plate is needed, but the source and drain electrode layer is directly used as the light-shielding mask plate for exposure) for back side exposure, in which the exposed portion is left to form the light-shielding layer. Thus, the complexity of the process and the manufacturing procedures are effectively reduced.

Figure 2:
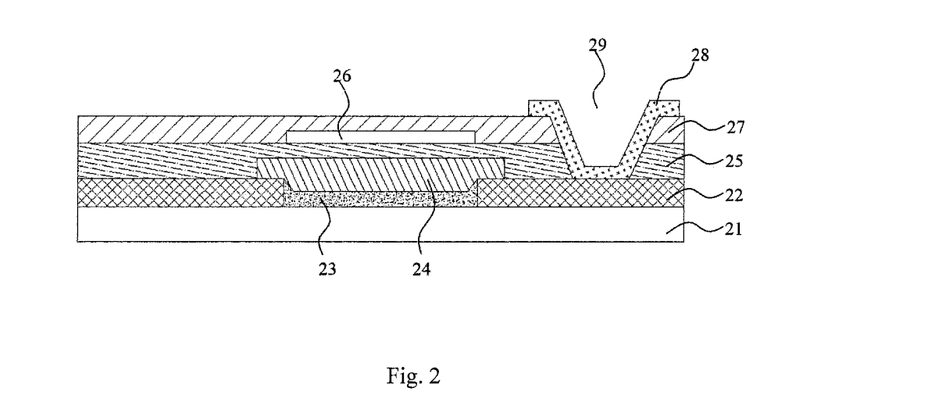
FIG. 2 is a structural schematic view of a top-gate thin film transistor according to an embodiment of the present disclosure.

Reference is made to FIG. 2, which shows a structural schematic view of the top-gate thin film transistor according to an embodiment of the present disclosure. The top-gate thin film transistor includes: a base substrate 21, a light-shielding layer 23 formed on the base substrate 21 and made of a non-metallic material, an active layer 24 formed on the light-shielding layer, an insulating layer 25 formed on the active layer 24, a source and drain electrode layer 22 formed between the insulating layer 25 and the base substrate 21, a gate electrode 26 formed on the insulating layer 25, a passivation layer 27 formed on the gate electrode 26 and the insulating layer 25, and a pixel electrode 28 formed on the passivation layer 27. The active layer 24 is connected to the source and drain electrode layer 22, and the pixel electrode 28 is connected to the source and drain electrode layer 22 through a via hole 29 provided in the passivation layer 27 and the insulating layer 25. The light-shielding layer is located between the source electrode layer and the drain electrode layer of the source and drain electrode layer and sandwiched between the base substrate and the active layer. Further, both sides of the light-shielding layer are in direct contact with the base substrate and the active layer, respectively.

As can be seen by comparing FIGS. 1 and 2, in the top-gate thin film transistor provided in the present disclosure, the light-shielding layer 23 serves as both a buffer layer and a light-shielding layer. In addition, in the top-gate thin film transistor provided in the present disclosure, the insulating layer 25 not only can prevent the gate electrode 26 and the source and drain electrode layer 22 from connecting together during the deposition, but also can function as a gate insulating layer. That is, the insulating layer 25 can function as an interlayer insulating layer and a gate insulating layer at the same time. It can be seen that, when the top-gate thin film transistor uses the non-metallic material as the light-shielding layer, not only the parasitic capacitance generated in the case of the metal layer being the light-shielding layer is avoided, but also the influence of light leakage on the active layer region can be effectively reduced (preventing light from emitting from the bottom during the working of the thin film transistor and thus from affecting the working performance of the thin film transistor).

As another embodiment of the present disclosure, the light-shielding layer 23 may be made of a photocurable silicone material. Using the photocurable silicone material as the light-shielding layer in the present disclosure not only avoids the parasitic capacitance generated in the case of the metal layer being the light-shielding layer, but also leads to the omission of the steps of metal sputter deposition and etching. Thus, it is possible to effectively reduce the complexity of the process and the manufacturing procedures.

As a further example of the present disclosure, the light-shielding layer 23 may be made of a negative photocurable silicone material. The photocurable silicone material is a negative photoresist that can be subjected to back side exposure through a self-alignment exposure technology (that is, no extra mask plate is needed, but the source and drain electrode layer is directly used as the light-shielding mask plate for exposure), so as to form the light-shielding layer 23 with the exposed portion left. Therefore, the complexity of the process and the manufacturing procedures are effectively reduced.

Specifically, in some embodiments of the present disclosure, the photocurable silicone material may be a polyhedral oligomeric silsesquioxane, which has a structure shown as follows:

in which each R is independently a photosensitive group derived from a negative photoresist.

In some other embodiments of the present disclosure, the photocurable silicone material may be a linear silicone resin, which has a structure shown as follows:

in which each R is independently a photosensitive group derived from a negative photoresist.

The light-shielding layer made of these photocurable silicone materials may better achieve the technical effects of the present disclosure.

More specifically, in some other embodiments of the present disclosure, R in the above structural formulas may be any one or more selected from photosensitive groups for (meth)acrylate based negative photoresists.

It shall be noted that, the present disclosure merely exemplifies the non-metallic materials that can serve as the light-shielding layer, but the light-shielding layer is not limited to the above-mentioned non-metallic materials. Under the teaching of the present disclosure, those skilled in the art may select the other non-metallic materials as the light-shielding layer as needed.

In order to improve the light-shielding effect of the light-shielding layer 23, a light-shielding material may be further added to the non-metallic material. Specifically, in some embodiments of the present disclosure, a fluorane black type dye and/or a crystal violet type dye is added to the photocurable silicone material, so as to improve the light-shielding effect and reduce the influence on the active layer.

In some embodiments of the present disclosure, the fluorane black type dye includes fluorane black (2-anilino-3-methyl-6-dibutylaminofluorane) and derivatives, mixtures and modifiers thereof. Such derivatives and modifiers are often widely used in the field of thermal paper printing, such as ODB, ODB-1 or the like, which are commercially available. The mixture may be a mixture of different types of fluorane black, such as a mixture of ODB and ODB-2, or the like; or it may be a mixture of a kind of fluorane black and other ingredients, such as a mixture of ODB-2 and CF-51, or the like. In one embodiment of the present disclosure, fluorane black ODB-2 is used.

In some embodiments of the present disclosure, the crystal violet type dye includes crystal violet, derivatives, modifiers and mixtures thereof, such as leuco crystal violet, crystal violet-d6, leuco crystal violet-d6, and the like. In one embodiment of the present disclosure, leuco crystal violet is used.

In some embodiments of the present disclosure, the active layer 24 is made of a metal oxide. The metal oxide may be selected from indium gallium zinc oxide (IGZO), zinc oxynitride (ZnON) and/or indium tin oxide (ITZO). The active layer 24 may have a thickness of from 500 nanometers to 1000 nanometers.

As a further embodiment of the present disclosure, the source and drain electrode layer 22 may be made of copper, molybdenum, aluminum, molybdenum niobium alloy, molybdenum copper alloy, or the like.

Figure 3A:
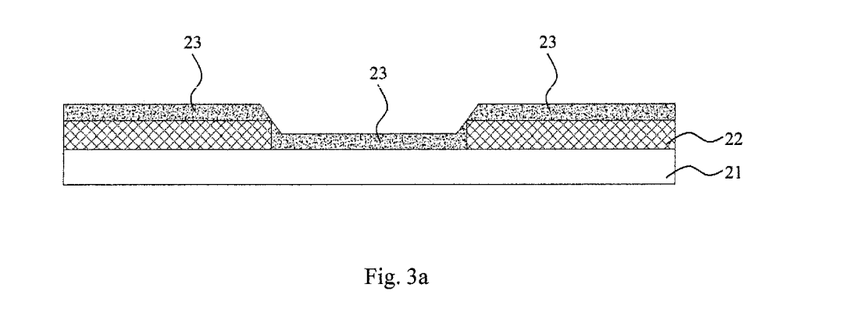
FIG. 3a is a structural schematic view before the back side exposure when the light-shielding layer has a thickness less than that of the source and drain electrode layer in an embodiment of the present disclosure.
Figure 3B:
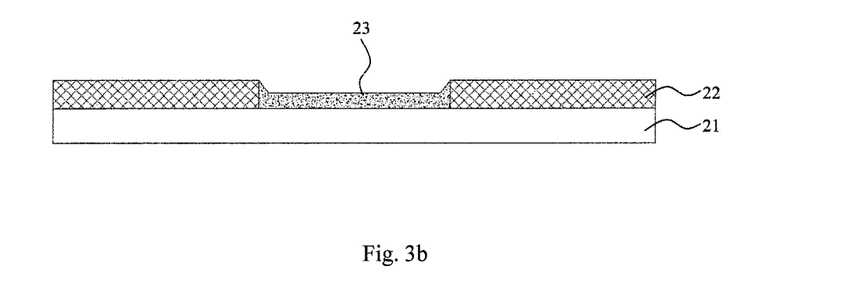
FIG. 3b is a structural schematic view after the back side exposure when the light-shielding layer has a thickness less than that of the source and drain electrode layer in the embodiment of the present disclosure.
Figure 4A:
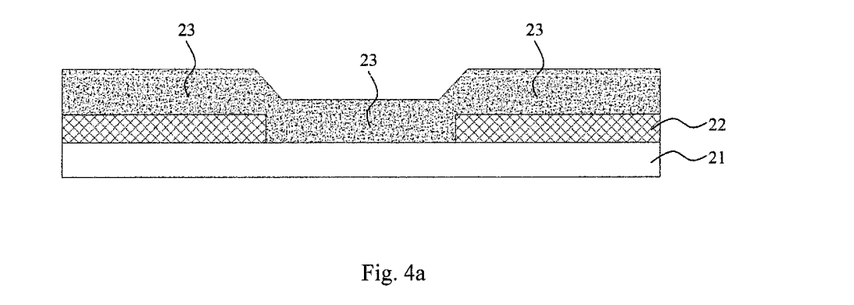
FIG. 4a is a structural schematic view before the back side exposure when the light-shielding layer has a thickness greater than that of the source and drain electrode layer in an embodiment of the present disclosure.
Figure 4B:
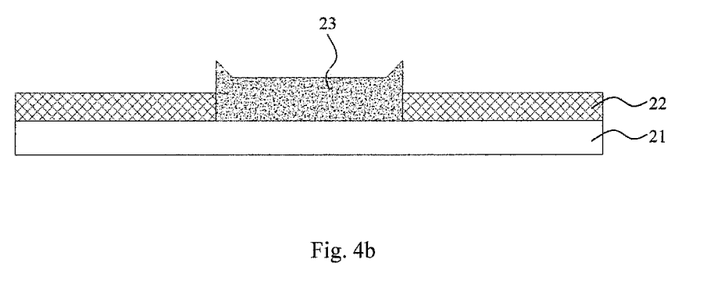
FIG. 4b is a structural schematic view after the back side exposure when the light-shielding layer has a thickness greater than that of the source and drain electrode layer in the embodiment of the present disclosure.

In some embodiments of the present disclosure, the light-shielding layer 23 has a thickness less than or equal to that of the source and drain electrode layer 22. FIG. 3a is a structural schematic view before the back side exposure when the light-shielding layer has a thickness less than that of the source and drain electrode layer in an embodiment of the present disclosure, and FIG. 3b is a structural schematic view after the back side exposure when the light-shielding layer has a thickness less than that of the source and drain electrode layer in the embodiment of the present disclosure. FIG. 4a is a structural schematic view before the back side exposure when the light-shielding layer has a thickness greater than that of the source and drain electrode layer in an embodiment of the present disclosure, and FIG. 4b is a structural schematic view after the back side exposure when the light-shielding layer has a thickness greater than that of the source and drain electrode layer in the embodiment of the present disclosure. As can be seen from FIGS. 3 and 4, if the thickness of the light-shielding layer 23 is greater than that of the source and drain electrode layer 22, a portion retained to form the light-shielding layer 23 through the back side exposure tends to form an inverted trapezoid, resulting in poor contact or breakage between the subsequently deposited active layer and the source and drain electrode layer. But if the thickness of the light-shielding layer is not greater than that of the source and drain electrode layer 22, this problem will not occur. Therefore, when the light-shielding layer 23 of the present disclosure has a thickness less than or equal to that of the source and drain electrode layer 22, it is possible to improve the contact between the active layer and the source and drain electrode layer and avoid the breakage of the light-shielding layer or the active layer.

In some embodiments of the present disclosure, the source and drain electrode layer has a thickness of from 1 to 2 micrometers, and/or the light-shielding layer has a thickness less than 1 micrometer, which may ensure good contact between the active layer and the source and drain electrode layer, and also can effectively reduce the influence of the light leakage on the active layer region.

Figure 5:
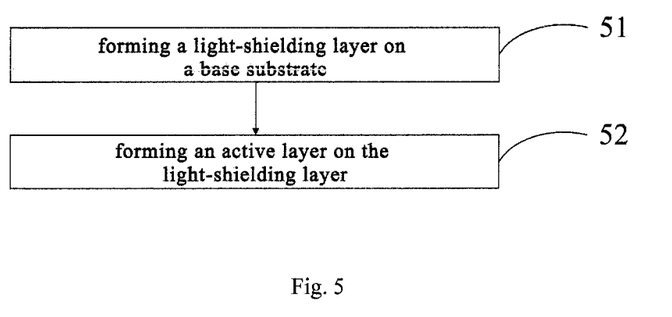
FIG. 5 is a flow chart of a method for manufacturing the top-gate thin film transistor according to one embodiment of the present disclosure.
Figure 6:
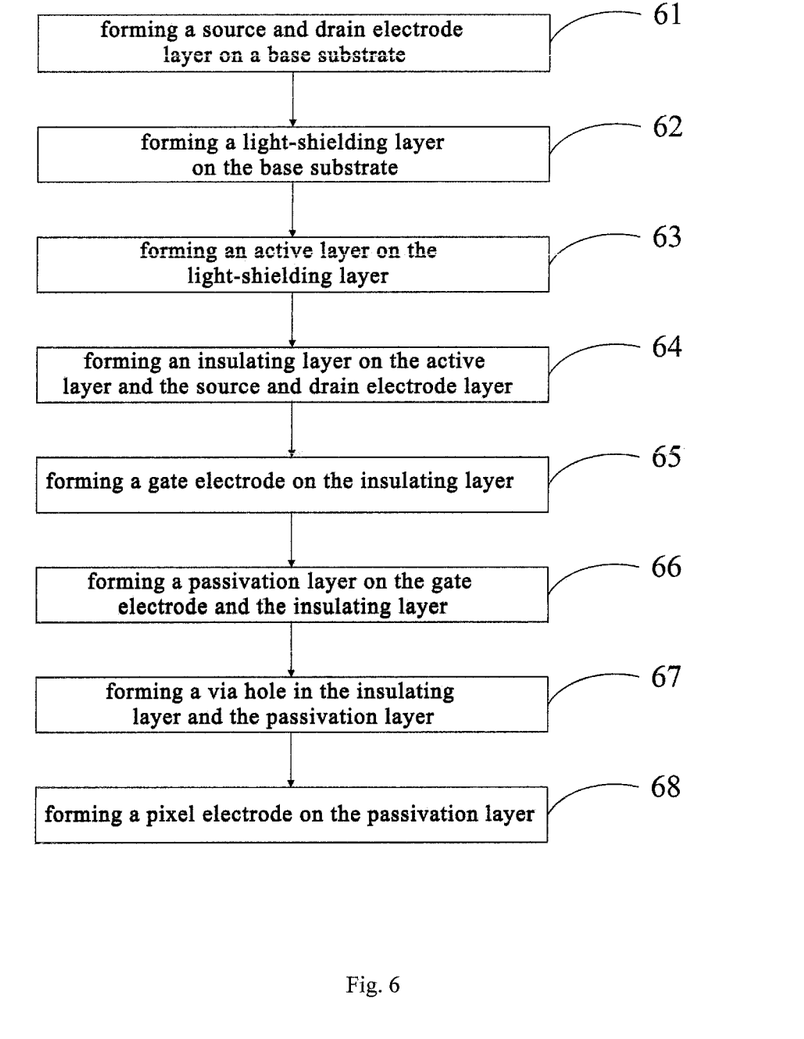
FIG. 6 is a flow chart of a method for manufacturing the top-gate thin film transistor according to another embodiment of the present disclosure.

The present disclosure further provides a method for manufacturing a top-gate thin film transistor, which, as shown in FIG. 5, includes the following steps:

Step 51: forming a light-shielding layer made of a non-metallic material on a base substrate; and Step 52: forming an active layer on the light-shielding layer.

It can be seen that, when the method for manufacturing the top-gate thin film transistor provided in the present disclosure uses the non-metallic material such as a photocurable silicone material as the light-shielding layer, not only the parasitic capacitance generated in the case of the metal layer being the light-shielding layer is avoided, but also the steps of metal sputter deposition and etching are omitted. Consequently, it is possible to effectively reduce the complexity of the process and the manufacturing procedures.

Specifically, as one embodiment of the present disclosure, the method for manufacturing the top-gate thin film transistor includes the following steps:

forming, on a base substrate, a source and drain electrode layer and a light-shielding layer which is made of a non-metallic material;

forming an active layer on the light-shielding layer;

forming an insulating layer on the active layer and the source and drain electrode layer;

forming a gate electrode on the insulating layer;

forming a passivation layer on the gate electrode and the insulating layer; and forming a pixel electrode on the passivation layer.

In some embodiments of the present disclosure, the step of forming the light-shielding layer on the base substrate includes: depositing a source and drain metal thin film on the base substrate and patterning the source and drain metal thin film to form the source and drain electrode layer; and depositing or coating a thin film of a non-metallic material on the source and drain electrode layer, and performing back side exposure and development on the thin film of the non-metallic material by using the source and drain electrode layer as a mask plate so as to form the light-shielding layer.

Thus, the method for manufacturing the top-gate thin film transistor provided in the present disclosure may adopt a self-alignment exposure technology (that is, no extra mask plate is needed, but the source and drain electrode layer is directly used as the light-shielding mask plate for exposure) for back side exposure, which leads to the omission of the manufacturing of a layer of mask, making it possible to effectively reduce the complexity of the process and the manufacturing procedures.

The method for manufacturing the top-gate thin film transistor will be described in detail below, which includes the following steps.

In step 61, a source and drain electrode layer is formed on a base substrate.

Figure 7:
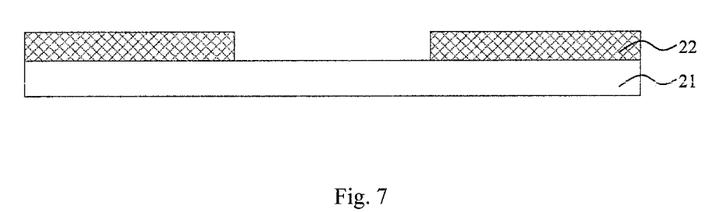
FIG. 7 is a structural schematic view of forming a source and drain electrode layer on a base substrate in the embodiment of the present disclosure.

FIG. 7 is a structural schematic view of forming the source and drain electrode layer on the base substrate in the embodiment of the present disclosure. Specifically, in this step, a source and drain metal thin film is first deposited on a base substrate 21, and then the thin film is patterned to form a source and drain electrode layer 22. Optionally, prior to the deposition of the source and drain metal thin film, the base substrate 21 is cleaned. As another embodiment of the present disclosure, the source and drain electrode layer 22 may be made of copper, molybdenum, aluminum, molybdenum niobium alloy, molybdenum copper alloy, or the like. In some embodiments of the present disclosure, the source and drain electrode layer may has a thickness of from 1 to 2 micrometers. It shall be noted that, the base substrate 21 is usually a glass substrate.

Figure 8:
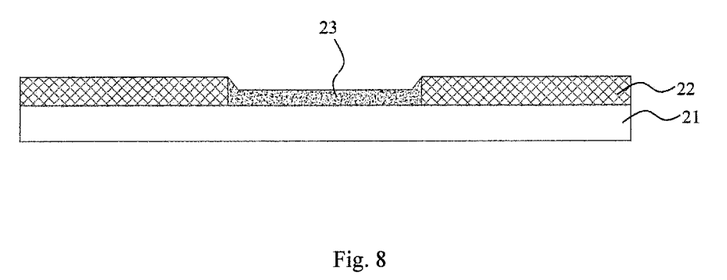
FIG. 8 is a structural schematic view of forming a light-shielding layer on the base substrate in the embodiment of the present disclosure.

In step 62, a light-shielding layer is formed on the base substrate.

FIG. 8 is a structural schematic view of forming the light-shielding layer on the base substrate in the embodiment of the present disclosure. Specifically, in this step, a thin film of a non-metallic material is deposited or coated on the source and drain electrode layer 22, and back side exposure and development (illuminating from the side of the base substrate 21) is performed on the thin film by using the source and drain electrode layer 22 as the mask plate, so as to form the light-shielding layer 23.

In some embodiments of the present disclosure, the non-metallic material may be a photocurable silicone material. Using the photocurable silicone material as the light-shielding layer in the present disclosure not only avoids the parasitic capacitance generated in the case of the metal layer being the light-shielding layer, but also leads to the omission of the steps of metal sputter deposition and etching. Thus, it is possible to effectively reduce the complexity of the process and the manufacturing procedures.

In some embodiments of the present disclosure, the non-metallic material may also be a photocurable silicone material. The photocurable organic material is a negative photoresist that can be subjected to back side exposure through a self-alignment exposure technology (that is, no extra mask plate is needed, but the source and drain electrode layer is directly used as the light-shielding mask plate for exposure), so as to form the light-shielding layer 23 with the exposed portion left. Therefore, the complexity of the process and the manufacturing procedures are effectively reduced.

Specifically, in some embodiments of the present disclosure, the photocurable silicone material may be a polyhedral oligomeric silsesquioxane, which has a structure shown as follows:

in which each R is independently a photosensitive group derived from a negative photoresist.

In some other embodiments of the present disclosure, the photocurable silicone material may be a linear silicone resin, which has a structure shown as follows:

in which each R is independently a photosensitive group derived from a negative photoresist.

More specifically, in some other embodiments of the present disclosure, R in the above structural formulas may be any one or more selected from photosensitive groups for acrylate based negative photoresists and methacrylate based negative photoresists. For example, R in the above structural formulas may include, but not limited to, methyl methacrylate, butyl acrylate, methyl acrylate, glyceryl methacrylate, etc.

It shall be noted that, the present disclosure merely exemplifies the non-metallic materials that can serve as the light-shielding layer, but the light-shielding layer is not limited to the above-mentioned non-metallic materials. Under the teaching of the present disclosure, those skilled in the art may select the other non-metallic materials as the light-shielding layer as needed provided that the object of solving the technical problems of the existence of the parasitic capacitance and the complex manufacturing process can be achieved.

In order to improve the light-shielding effect of the light-shielding layer 23, a light-shielding material may be further added to the non-metallic material. Specifically, in some embodiments of the present disclosure, a fluorane black type dye and/or a crystal violet type dye is added to the photocurable silicone material, so as to improve the light-shielding effect and reduce adverse effect on the active layer.

In some embodiments of the present disclosure, the thickness of the light-shielding layer is less than or equal to that of the source and drain electrode layer, so as to improve the good contact between the active layer and the source and drain electrode layer and avoid the breakage of the light-shielding layer or the active layer. Further, the light-shielding layer has a thickness less than 1 micrometer, so as to ensure the good contact between the active layer and the source and drain electrode layer as well as the effective reduction of the adverse effect of the light leakage on the active layer region.

Figure 9:
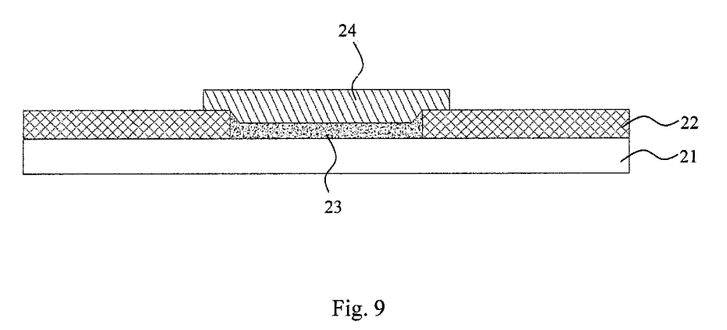
FIG. 9 is a structural schematic view of forming an active layer on the light-shielding layer in the embodiment of the present disclosure.

In step 63, an active layer is formed on the light-shielding layer.

Reference is made to FIG. 9, which is a structural schematic view of forming the active layer on the light-shielding layer in the embodiment of the present disclosure. Specifically, in this step, the active layer 24 is usually made of a semiconductor, which may be a metal oxide, hydrogenated amorphous silicon (a-Si:H), or a low temperature polysilicon (LTPS). The metal oxide may be a metal oxide containing at least one of In, Zn, Ga and Sn. For example, the metal oxide may be selected from indium gallium zinc oxide (IGZO), indium tin zinc oxide (ISZO), zinc oxynitride (ZnON) and/or indium tin oxide (ITZO).

Figure 10:
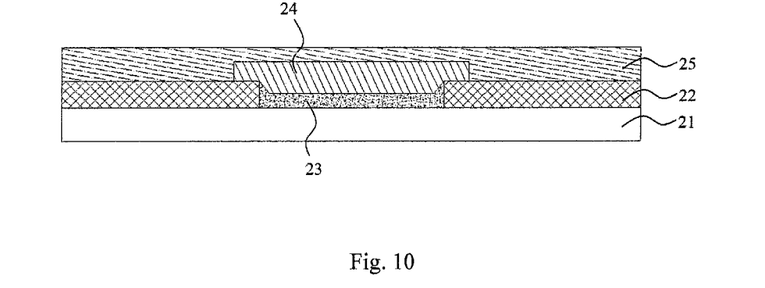
FIG. 10 is a structural schematic view of forming an insulating layer on the active layer and the source and drain electrode layer in the embodiment of the present disclosure.

In step 64, an insulating layer is formed on the active layer and the source and drain electrode layer.

FIG. 10 is a structural schematic view of forming the insulating layer on the active layer and the source and drain electrode layer in the embodiment of the present disclosure. Specifically, in this step, a thin film of an insulating material (such as SiN$_x$ or SiO$_2$) is deposited on the active layer 24 and the source and drain electrode layer 22, and then subjected to photolithographic patterning to form the insulating layer 25. The insulating material may also be an organic insulating material.

Figure 11:
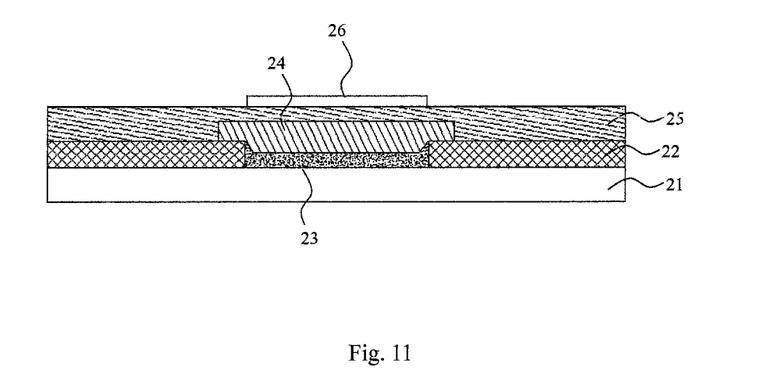
FIG. 11 is a structural schematic view of forming a gate electrode on the insulating layer in the embodiment of the present disclosure.

In step 65, a gate electrode is formed on the insulating layer.

FIG. 11 is a structural schematic view of forming the gate electrode on the insulating layer in the embodiment of the present disclosure. Specifically, in this step, the gate electrode 26 may be a layer of metal such as copper, or a laminate of a plurality of metal layers.

Figure 12:
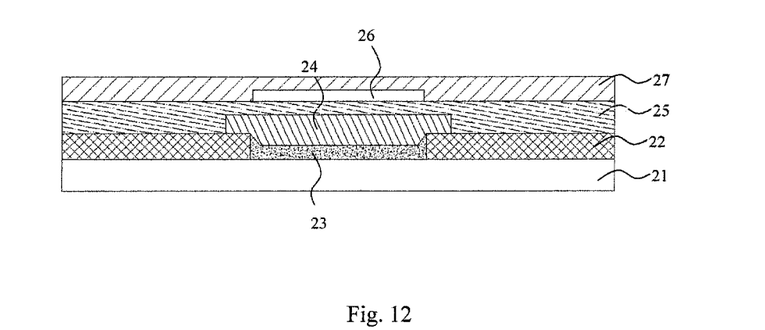
FIG. 12 is a structural schematic view of forming a passivation layer on the gate electrode and the insulating layer in the embodiment of the present disclosure.

In step 66, a passivation layer is formed on the gate electrode and the insulating layer.

FIG. 12 is a structural schematic view of forming the passivation layer on the gate electrode and the insulating layer in the embodiment of the present disclosure. Specifically, in this step, a thin film of a passivation material is deposited on the gate electrode and the insulating layer, and then patterned to form passivation layer 27. The passivation layer 27 serves the insulating and encapsulating functions.

Figure 13:
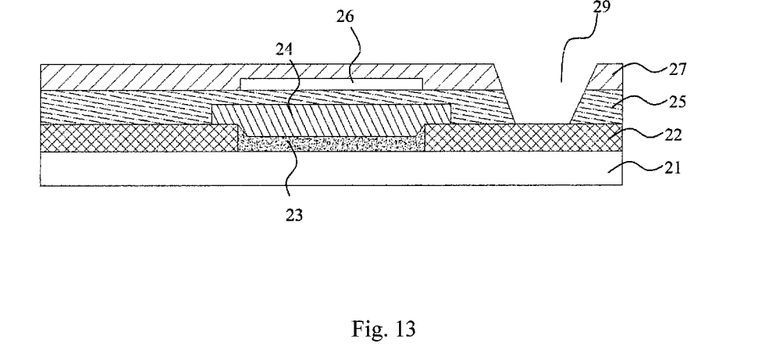
FIG. 13 is a structural schematic view of forming a via hole in the passivation layer and the insulating layer in the embodiment of the present disclosure.

In step 67, a via hole is formed in the insulating layer and the passivation layer.

FIG. 13 is a structural schematic view of forming the via hole in the passivation layer and the insulating layer in the embodiment of the present disclosure. In this embodiment, no hole is formed subsequent to the formation of the insulating layer 25, but after the passivation layer 27 is formed, the insulating layer 25 and the passivation layer 27 are collectively punched through until the source and drain electrode layer 22, so as to form via hole 29.

Figure 14:
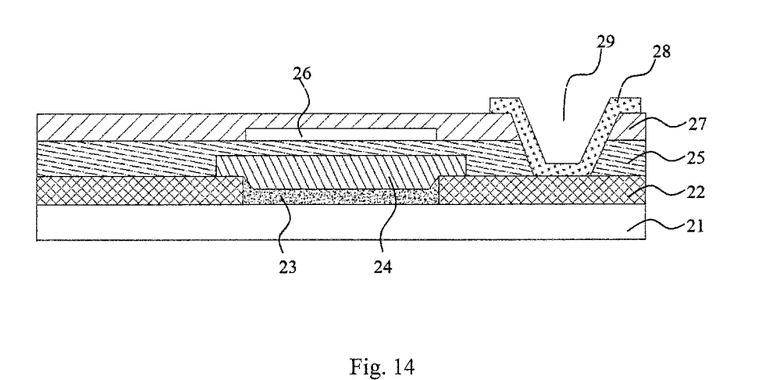
FIG. 14 is a structural schematic view of forming a pixel electrode on the passivation layer in the embodiment of the present disclosure.

In step 68, a pixel electrode is formed on the passivation layer.

FIG. 14 is a structural schematic view of forming the pixel electrode on the passivation layer in the embodiment of the present disclosure. In this step, a thin film of an electrically conductive material is formed on the passivation layer and then patterned to form the pixel electrode. The pixel electrode 28 is connected to the source and drain electrode layer 22 through the via hole 29 provided in the passivation layer 27 and the insulating layer 25. The pixel electrode 28 may be a transparent conductive film layer, such as a transparent conductive layer of indium tin oxide.

Figure 15:
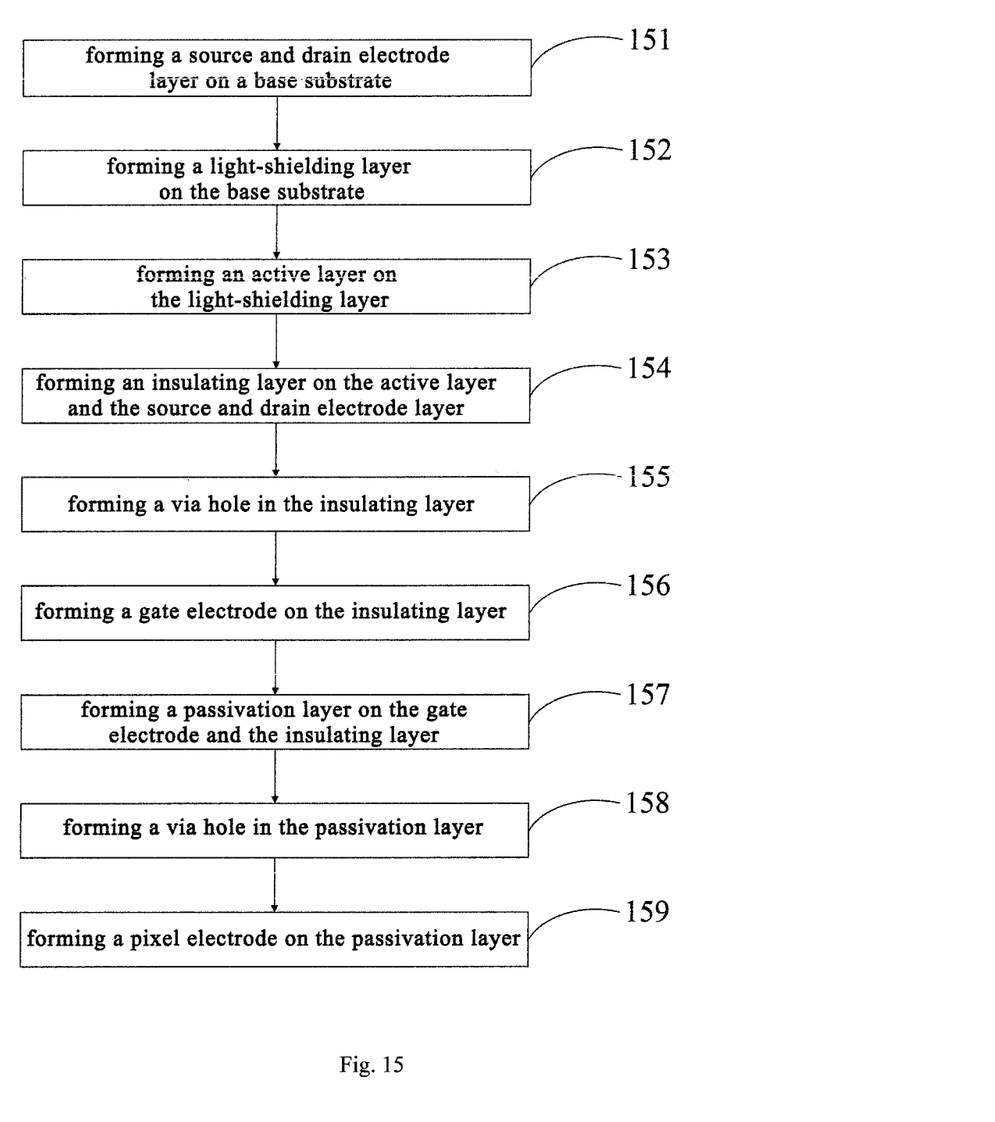
FIG. 15 is a flow chart of a method for manufacturing a top-gate thin film transistor in another embodiment of the present disclosure.

As another embodiment of the present disclosure, as shown in FIG. 15, a method for manufacturing the top-gate thin film transistor includes the following steps:

Step 151: forming a source and drain electrode layer on a base substrate;

Step 152: forming a light-shielding layer on the base substrate;

Step 153: forming an active layer on the light-shielding layer;

Step 154: forming an insulating layer on the active layer and the source and drain electrode layer;

Step 155: forming a via hole in the insulating layer;

Step 156: forming a gate electrode on the insulating layer;

Step 157: forming a passivation layer on the gate electrode and the insulating layer;

Step 158: forming a via hole in the passivation layer;

Step 159: forming a pixel electrode on the passivation layer.

The steps 151 to 154, 156 to 157 and 159 may be the same as those described above, and will not be repeated here.

Figure 16:
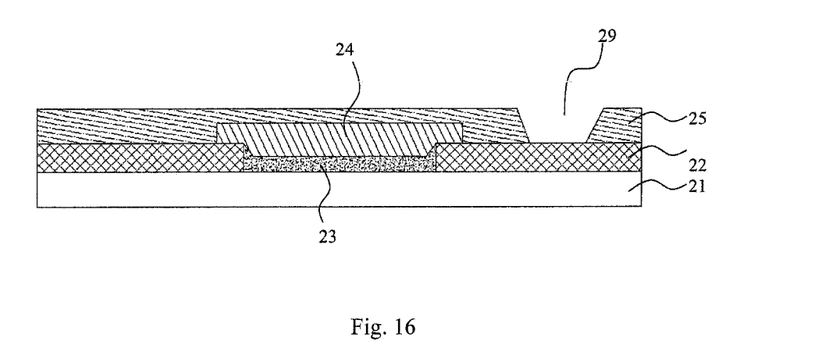
FIG. 16 is a structural schematic view of forming a via hole in the insulating layer in the embodiment of the present disclosure.
Figure 17:
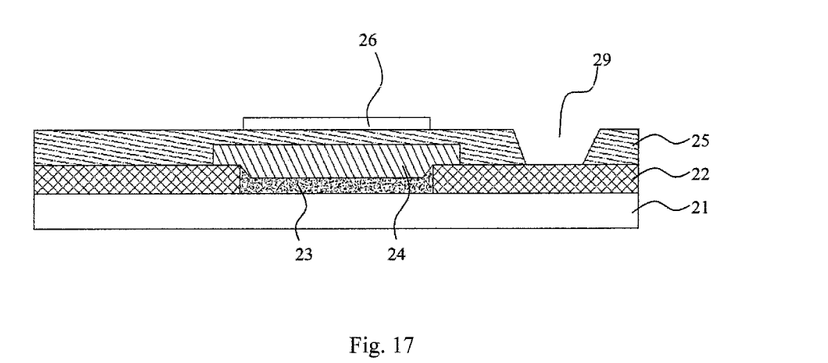
FIG. 17 is a structural schematic view of forming a via hole in the passivation layer in the embodiment of the present disclosure.

As shown in FIGS. 16 to 17, in this embodiment, the via hole is formed in a stepwise manner: first forming a hole in the insulating layer 25 (step 155), subsequently forming the gate electrode 26 and passivation layer 27 and then forming a hole in the passivation layer 27 to be in communication with the source and drain electrode layer 22 (step 158).

The present disclosure further provides an array substrate including the top-gate thin film transistor in any of the embodiments as described above, which can reduce the complexity of the manufacturing process of the oxide thin film transistor array substrate.

The present disclosure further provides a display panel including the top-gate thin film transistor in any of the embodiments as described above.

It can be seen that, when the top-gate thin film transistor provided in the present disclosure adopts the non-metallic material as the light-shielding layer, not only the parasitic capacitance generated in the case of the metal layer being the light-shielding layer is avoided, but also the adverse effect of light leakage on the active layer region can be effectively reduced. Accordingly, the product yield and device performance are effectively improved. Furthermore, it is also possible to simplify the structure of the thin film transistor, making it possible to effectively reduce the complexity of the process and the manufacturing procedures of the thin film transistor. Moreover, the method for manufacturing the top-gate thin film transistor provided in the present disclosure may adopt a self-alignment exposure technology (that is, no extra mask plate is needed, but the source and drain electrode layer is directly used as the light-shielding mask plate for exposure) for back side exposure, in which the exposed portion is left to form the light-shielding layer 23. Thus, the complexity of the process and the manufacturing procedures are effectively reduced.

It shall be understood by those having ordinary skills in the art that the discussion of any of the embodiments as described above is merely illustrative and not intended to imply the scope of the present disclosure (including the claims) is limited to these embodiments and that, under the concept of the present disclosure, the above embodiments or technical features in different embodiments may be combined and there are also many other changes to the different aspects of the present disclosure, which are not provided in detail for simplicity. Therefore, any omissions, modifications, equivalent alternatives or improvements within the spirit and principle of the present disclosure shall be all encompassed in the protection scope of the present disclosure.

What is claimed is:

1. A top-gate thin film transistor, comprising a light-shielding layer formed between a base substrate and an active layer and made of a non-metallic material, an insulating layer arranged on the active layer, and a gate electrode arranged on the insulating layer, wherein the light-shielding layer is located between a source electrode layer and a drain electrode layer of a source and drain electrode layer and in direct contact with the source electrode layer and the drain electrode layer, sandwiched between the base substrate and the active layer, and wherein an orthogonal projection of the light-shielding layer on the base substrate does not overlap an orthogonal projection of the source and drain electrode layer on the base substrate;

wherein the light-shielding layer has a thickness less than or equal to that of the source and drain electrode layer;

wherein the light-shielding layer is made of a photocurable silicone material; and wherein the photocurable silicone material is a polyhedral oligomeric silsesquioxane or a linear silicone resin;

the polyhedral oligomeric silsesquioxane has a structure shown as follows:

the linear silicone resin has a structure shown as follows:

in which each R is independently a photosensitive group derived from a negative photoresist.

2. The top-gate thin film transistor according to claim 1, wherein the light-shielding layer is made of a negative photocurable silicone material.

3. The top-gate thin film transistor according to claim 1, wherein a fluorane black type dye or a crystal violet type dye is added to the photocurable silicone material.

4. The top-gate thin film transistor according to claim 1, wherein both sides of the light-shielding layer are in direct contact with the base substrate and the active layer, respectively.

5. The top-gate thin film transistor according to claim 1, wherein the source and drain electrode layer has a thickness of from 1 to 2 micrometers; and/or the light-shielding layer has a thickness less than 1 micrometer.

6. A method for manufacturing a top-gate thin film transistor, comprising steps of:
    forming a light-shielding layer made of a non-metallic material on a base substrate;
    forming an active layer on the light-shielding layer,
    forming an insulating layer on the active layer, and
    forming a gate electrode on the insulating layer,
    wherein the step of forming the light-shielding layer on the base substrate comprises:
    depositing a source and drain metal thin film on the base substrate, and patterning the source and drain metal thin film to form a source and drain electrode layer; and
    depositing or coating a thin film of a non-metallic material on the source and drain electrode layer, and performing back side exposure and development on the thin film of the non-metallic material by using the source and drain electrode layer as a mask plate to form the light-shielding layer,
    such that the light-shielding layer is located between a source electrode layer and a drain electrode layer of the source and drain electrode layer and in direct contact with the source electrode layer and the drain electrode layer, sandwiched between the base substrate and the active layer, and
    wherein an orthogonal projection of the light-shielding layer on the base substrate does not overlap an orthogonal projection of the source and drain electrode layer on the base substrate;
    wherein the light-shielding layer has a thickness less than or equal to that of the source and drain electrode layer;
    wherein the light-shielding layer is made of a photocurable silicone material; and
    wherein the photocurable silicone material is a polyhedral oligomeric silsesquioxane or a linear silicone resin;
    the polyhedral oligomeric silsesquioxane has a structure shown as follows:

the linear silicone resin has a structure shown as follows:

in which each R is independently a photosensitive group derived from a negative photoresist.

7. The method according to claim 6, wherein the light-shielding layer is made of a negative photocurable silicone material.

8. The method according to claim 6, wherein a fluorane black type dye or a crystal violet type dye is added to the photocurable silicone material.

9. An array substrate, comprising the top-gate thin film transistor according to claim 1.

10. A display panel, comprising the array substrate according to claim 9.

11. The top-gate thin film transistor according to claim 1, wherein the insulating layer is not made of a light-shielding material.

12. The method according to claim 6, wherein the insulating layer is not made of a light-shielding material.

13. The array substrate according to claim 9, wherein the insulating layer is not made of a light-shielding material.

14. The array substrate according to claim 10, wherein the insulating layer is not made of a light-shielding material.

* * * * *